(12) United States Patent
Lin et al.

(10) Patent No.: US 8,432,631 B1
(45) Date of Patent: Apr. 30, 2013

(54) DISK SPINDLE ASSEMBLY CARTRIDGE

(75) Inventors: Tao Lin, San Jose, CA (US); Chih-Wu Jen, Longmont, CO (US); Chunjer C. Cheng, Saratoga, CA (US); Gang H. Lin, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 13/491,283

(22) Filed: Jun. 7, 2012

Related U.S. Application Data

(62) Division of application No. 12/610,206, filed on Oct. 30, 2009, now Pat. No. 8,218,256.

(51) Int. Cl.
G11B 27/36 (2006.01)
G11B 33/12 (2006.01)

(52) U.S. Cl.
USPC .............................. 360/31; 73/865.9; 324/210

(58) Field of Classification Search .................... 360/31; 324/210, 212, 262; 702/108, 118; 73/865.9
See application file for complete search history.

(56) References Cited

U.S. PATENT DOCUMENTS

| | | | |
|---|---|---|---|
| 4,346,416 A | 8/1982 | Riggle et al. | |
| 4,845,579 A | 7/1989 | Wilkinson, Jr. | |
| 4,862,584 A * | 9/1989 | Budy et al. | 29/704 |
| 4,902,971 A | 2/1990 | Guzik et al. | |
| 5,029,026 A | 7/1991 | Stefansky et al. | |
| 5,109,310 A | 4/1992 | Ohkjita et al. | |
| 5,299,944 A | 4/1994 | Larabell et al. | |
| 5,339,204 A * | 8/1994 | James et al. | 360/51 |
| 5,404,636 A | 4/1995 | Stefansky et al. | |
| 5,666,243 A | 9/1997 | Brent | |
| 5,741,055 A | 4/1998 | Chen | |
| 5,757,587 A | 5/1998 | Berg et al. | |
| 5,760,989 A * | 6/1998 | Colban | 360/75 |
| 5,786,677 A | 7/1998 | Marr | |
| 5,801,531 A | 9/1998 | Viches et al. | |
| 5,801,901 A | 9/1998 | Bryan et al. | |
| 5,805,377 A | 9/1998 | Lerdal et al. | |
| 5,825,180 A | 10/1998 | Guzik | |
| 5,905,606 A | 5/1999 | Johnson et al. | |
| 6,049,969 A * | 4/2000 | Jenkins et al. | 29/737 |
| 6,099,362 A | 8/2000 | Viches et al. | |
| 6,140,661 A | 10/2000 | Nodelman | |
| 6,140,815 A | 10/2000 | Greene et al. | |
| 6,144,516 A * | 11/2000 | Takeda et al. | 360/75 |
| 6,150,813 A | 11/2000 | Schadewald, Jr. et al. | |
| 6,169,413 B1 | 1/2001 | Paek et al. | |
| 6,222,291 B1 | 4/2001 | Boutaghou | |

(Continued)

OTHER PUBLICATIONS

Notice of Allowance dated Feb. 3, 2012 from U.S. Appl. No. 12/610,206, 17 pages.

(Continued)

*Primary Examiner* — Angel Castro

(57) ABSTRACT

A disk spindle assembly cartridge is described. The disk spindle assembly cartridge includes a base, a spindle motor attached to the base, a disk seated on the spindle motor, a disk clamp attached to the spindle motor, wherein the disk clamp secures the disk to the spindle motor, and a cover attached to the base. The base is configured to detachably mount a head stack assembly cartridge, where the disk is accessible to a head stack assembly pivotally mounted in the head stack assembly cartridge via an opening defined by the base and the cover.

14 Claims, 7 Drawing Sheets

U.S. PATENT DOCUMENTS

| | | | |
|---|---|---|---|
| 6,226,157 B1 | 5/2001 | Kim | |
| 6,227,516 B1 | 5/2001 | Webster, Jr. et al. | |
| 6,229,303 B1 | 5/2001 | Guzik | |
| 6,236,201 B1 | 5/2001 | Kilicci et al. | |
| 6,242,910 B1 | 6/2001 | Guzik et al. | |
| 6,252,738 B1 | 6/2001 | Slezak | |
| 6,346,809 B1 | 2/2002 | Karam, II | |
| 6,414,807 B2 * | 7/2002 | Bates et al. | 360/51 |
| 6,421,236 B1 | 7/2002 | Montoya et al. | |
| 6,434,499 B1 | 8/2002 | Ulrich et al. | |
| 6,466,400 B1 | 10/2002 | Iwahara et al. | |
| 6,472,866 B2 | 10/2002 | Aslami | |
| 6,507,992 B1 * | 1/2003 | Jenkins et al. | 29/603.03 |
| 6,510,752 B1 | 1/2003 | Sacks et al. | |
| 6,526,841 B1 | 3/2003 | Wanek et al. | |
| 6,531,867 B1 | 3/2003 | Greene et al. | |
| 6,566,870 B2 | 5/2003 | Sorenson et al. | |
| 6,571,454 B1 | 6/2003 | Haney et al. | |
| 6,679,128 B2 | 1/2004 | Wanek et al. | |
| 6,696,831 B2 | 2/2004 | Nozu | |
| 6,781,796 B2 | 8/2004 | Macpherson et al. | |
| 6,798,650 B2 | 9/2004 | Reznikov et al. | |
| 6,806,700 B2 | 10/2004 | Wanek et al. | |
| 6,853,185 B2 | 2/2005 | Tsukamoto et al. | |
| 6,900,961 B1 * | 5/2005 | Butler | 360/97.13 |
| 6,930,850 B2 | 8/2005 | Takagi et al. | |
| 6,943,971 B2 | 9/2005 | Kainuma et al. | |
| 7,054,150 B2 | 5/2006 | Orriss et al. | |
| 7,061,235 B2 | 6/2006 | Guzik et al. | |
| 7,076,391 B1 | 7/2006 | Pakzad et al. | |
| 7,088,541 B2 | 8/2006 | Orriss et al. | |
| 7,131,346 B1 | 11/2006 | Buttar et al. | |
| 7,203,060 B2 | 4/2007 | Kay et al. | |
| 7,248,039 B2 | 7/2007 | Green et al. | |
| 7,288,935 B2 | 10/2007 | Farren et al. | |
| 7,295,002 B2 | 11/2007 | Guzik et al. | |
| 7,342,780 B2 | 3/2008 | Scicluna et al. | |
| 7,352,536 B2 | 4/2008 | Kim | |
| 7,355,393 B2 | 4/2008 | Tokutomi et al. | |
| 7,376,537 B2 | 5/2008 | Delory, Jr. | |
| 7,490,398 B1 * | 2/2009 | Klassen et al. | 29/603.04 |
| 7,518,814 B2 | 4/2009 | Umezaki et al. | |
| 7,529,062 B2 | 5/2009 | Xu | |
| 7,532,006 B2 | 5/2009 | Guzik et al. | |
| 7,646,596 B2 | 1/2010 | Ng | |
| 7,705,588 B2 | 4/2010 | Eaton et al. | |
| 7,836,603 B2 | 11/2010 | Guzik et al. | |
| 7,840,664 B2 | 11/2010 | Dugatkin et al. | |
| 7,880,463 B2 | 2/2011 | Guzik et al. | |
| 8,027,801 B2 | 9/2011 | Nishiuchi et al. | |
| 8,218,256 B1 | 7/2012 | Lin et al. | |
| 8,270,118 B1 | 9/2012 | Cheng et al. | |
| 2003/0218827 A1 | 11/2003 | Teo et al. | |
| 2005/0018397 A1 | 1/2005 | Kay et al. | |
| 2005/0219809 A1 | 10/2005 | Muncaster et al. | |
| 2006/0085158 A1 | 4/2006 | Cakiner | |
| 2006/0152856 A1 | 7/2006 | Zhao et al. | |
| 2007/0034368 A1 | 2/2007 | Atkins et al. | |
| 2007/0046286 A1 | 3/2007 | Umezaki et al. | |
| 2007/0136021 A1 | 6/2007 | Anderson et al. | |
| 2007/0143054 A1 | 6/2007 | Anderson et al. | |
| 2007/0143056 A1 | 6/2007 | Anderson et al. | |
| 2007/0143057 A1 | 6/2007 | Anderson et al. | |
| 2007/0205763 A1 | 9/2007 | Yamasaki | |
| 2008/0007865 A1 | 1/2008 | Orriss et al. | |
| 2008/0060445 A1 | 3/2008 | Obergfell et al. | |
| 2008/0062855 A1 | 3/2008 | Warn et al. | |
| 2008/0225701 A1 | 9/2008 | Pimlott | |
| 2008/0247091 A1 | 10/2008 | Guzik et al. | |
| 2009/0009954 A1 | 1/2009 | Bushby et al. | |
| 2009/0153992 A1 | 6/2009 | Garcia et al. | |
| 2011/0149424 A1 | 6/2011 | Dalphy et al. | |

OTHER PUBLICATIONS

Notice of Allowance dated Mar. 14, 2012 from U.S. Appl. No. 12/610,206, 12 pages.

* cited by examiner

DISK SPINDLE ASSEMBLY CARTRIDGE

CROSS-REFERENCE TO RELATED APPLICATIONS

This application is a divisional of U.S. patent application Ser. No. 12/610,206, filed on Oct. 30, 2009, which is hereby incorporated by reference in its entirety.

FIELD

The present disclosure generally concerns a hard drive component testing platform and, in particular, is directed to a disk spindle assembly cartridge.

BACKGROUND

Component testing plays an important role during the manufacture and assembly of hard drives. Testing individual components allows the manufacturer to determine whether specifications of a new design have been met prior to incorporating the new component into a fully assembled hard drive. Testing representative component samples provides a measure of quality control that may prevent the wasteful assembly of a large number of hard drives using a faulty batch of components. However, many conventional hard drive component testing systems fail to create a testing environment similar to that experienced by components in an operating hard drive. Accordingly, these conventional systems are limited in the number and range of parameters that can be tested before the component is incorporated into a working hard drive.

Conventional testing systems typically are expensive and relatively complex systems. Conventional testing systems may cost several hundreds of thousands, and possibly millions, of dollars to purchase and maintain. This expense limits the number of testing systems a manufacturer can purchase given a limited budget, which correspondingly limits the number of components that can be tested within a given time frame. Many conventional component testing systems are complex pieces of equipment requiring special training and/or special tools to set up and operate. This complexity limits the efficiency and increases the overall costs associated with operating and maintaining the systems.

SUMMARY

The disk spindle assembly cartridge described in the present disclosure is part of a modular hard drive component tester designed to address the foregoing deficiencies of conventional testing systems. This novel hard drive component tester is designed to use as many production hard drive components as possible to both keep down costs of the testing platform and to help recreate a testing environment similar to that experienced by components in an operating hard drive. As described herein, various structures from production hard drives have been modified to provide a reliable and relatively easy to operate tester.

According to one aspect of the present disclosure, a disk spindle assembly cartridge is described. The disk spindle assembly cartridge includes a base, a spindle motor attached to the base, a disk seated on the spindle motor, a disk clamp attached to the spindle motor, wherein the disk clamp secures the disk to the spindle motor, and a cover attached to the base. The base is configured to detachably mount a head stack assembly cartridge, where the disk is accessible to a head stack assembly pivotally mounted in the head stack assembly cartridge via an opening defined by the base and the cover.

According to another aspect of the present disclosure, a hard drive component tester is described. The hard drive component testing platform includes a chassis plate, a disk spindle assembly cartridge removably mounted on a top surface of the chassis plate, and a printed circuit board assembly mounted on the chassis plate. The disk spindle assembly cartridge includes a base, a spindle motor attached to the base, a disk seated on the spindle motor, a disk clamp attached to the spindle motor, wherein the disk clamp secures the disk to the spindle motor, and a cover attached to the base. The base is configured to detachably mount a head stack assembly cartridge, where the disk is accessible to a head stack assembly pivotally mounted in the head stack assembly cartridge via an opening defined by the base and the cover. The printed circuit board assembly includes a first interface electrically connected to the spindle motor, a second interface configured to electrically connect to the head stack assembly, and a third interface for electrically connecting the printed circuit board assembly to a tester controller.

According to another aspect of the present disclosure, a method for test mounting a magnetic disk is provided. The method includes securing a disk to a spindle motor attached to a base. A cover plate is then attached to the base. The base is configured to detachably mount a head stack assembly cartridge comprising a head stack assembly. The base and the cover plate define an opening to make the disk accessible to the head stack assembly.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components have been simplified or omitted from the figures to avoid obscuring the concepts of the subject technology.

Figure 1:
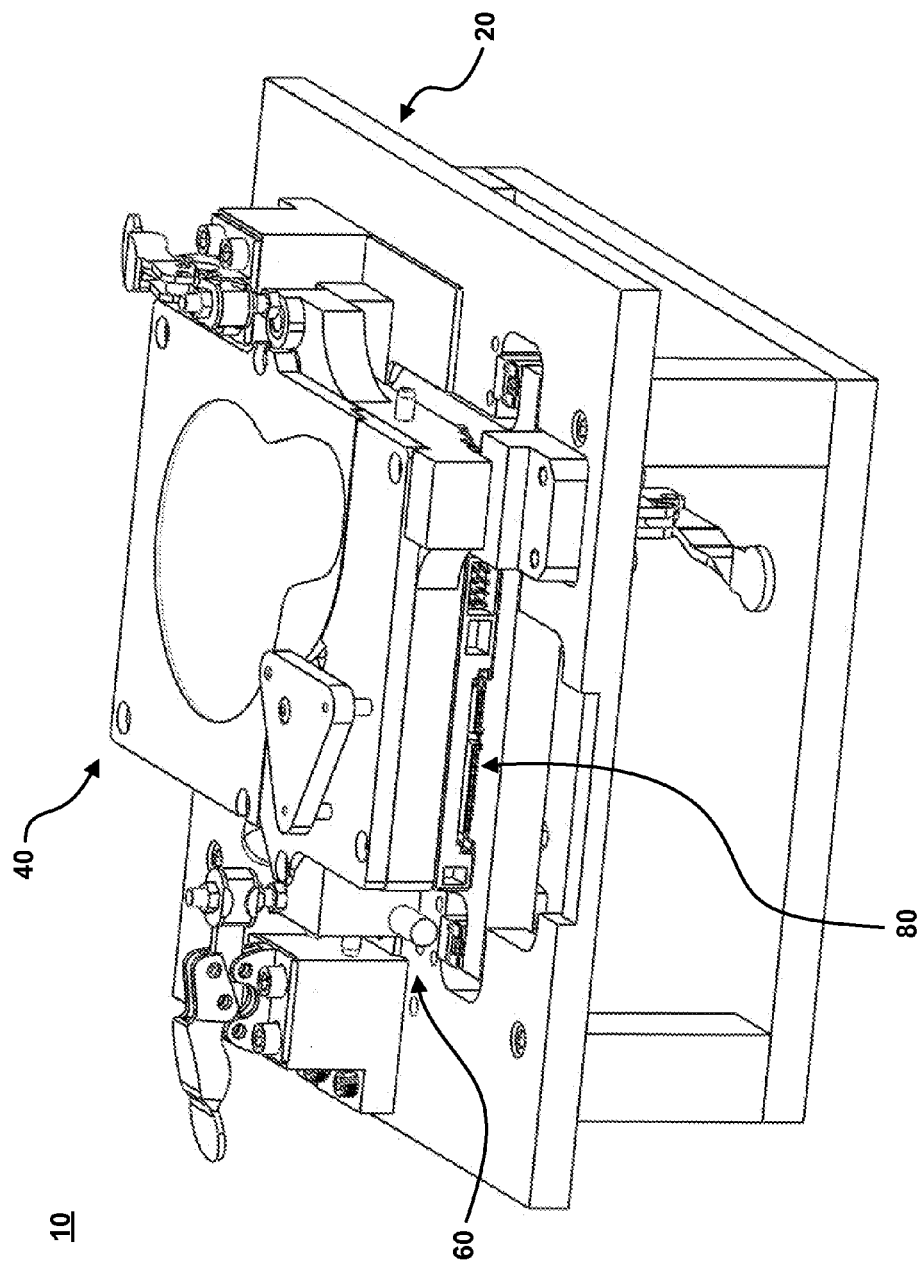
FIG. 1 is a perspective view of a hard drive component test platform according to one configuration.

FIG. 1 is a perspective view of hard drive component tester 10 according to one embodiment. Tester 10 provides a modular testing platform comprising four primary components: tester chassis 20, disk spindle assembly cartridge 40, head stack assembly cartridge 60, and printed circuit board assembly 80. Tester chassis 20 is configured to allow each of the other components to be mounted and dismounted from tester chassis 20 by an operator. Disk spindle assembly cartridge 40 contains a magnetic disk mounted to a spindle motor configured to rotate the disk. Head stack assembly cartridge 60 contains a head stack assembly and is configured to be mated with disk spindle assembly cartridge 40. Printed circuit board assembly 80 contains firmware and power and control circuitry used to operate the spindle motor in disk spindle assembly cartridge 40 and the head stack assembly in head stack assembly cartridge 60 as well as to interface with a tester controller such as a computer configured to run tests using tester 10 and record the results.

Figure 2:
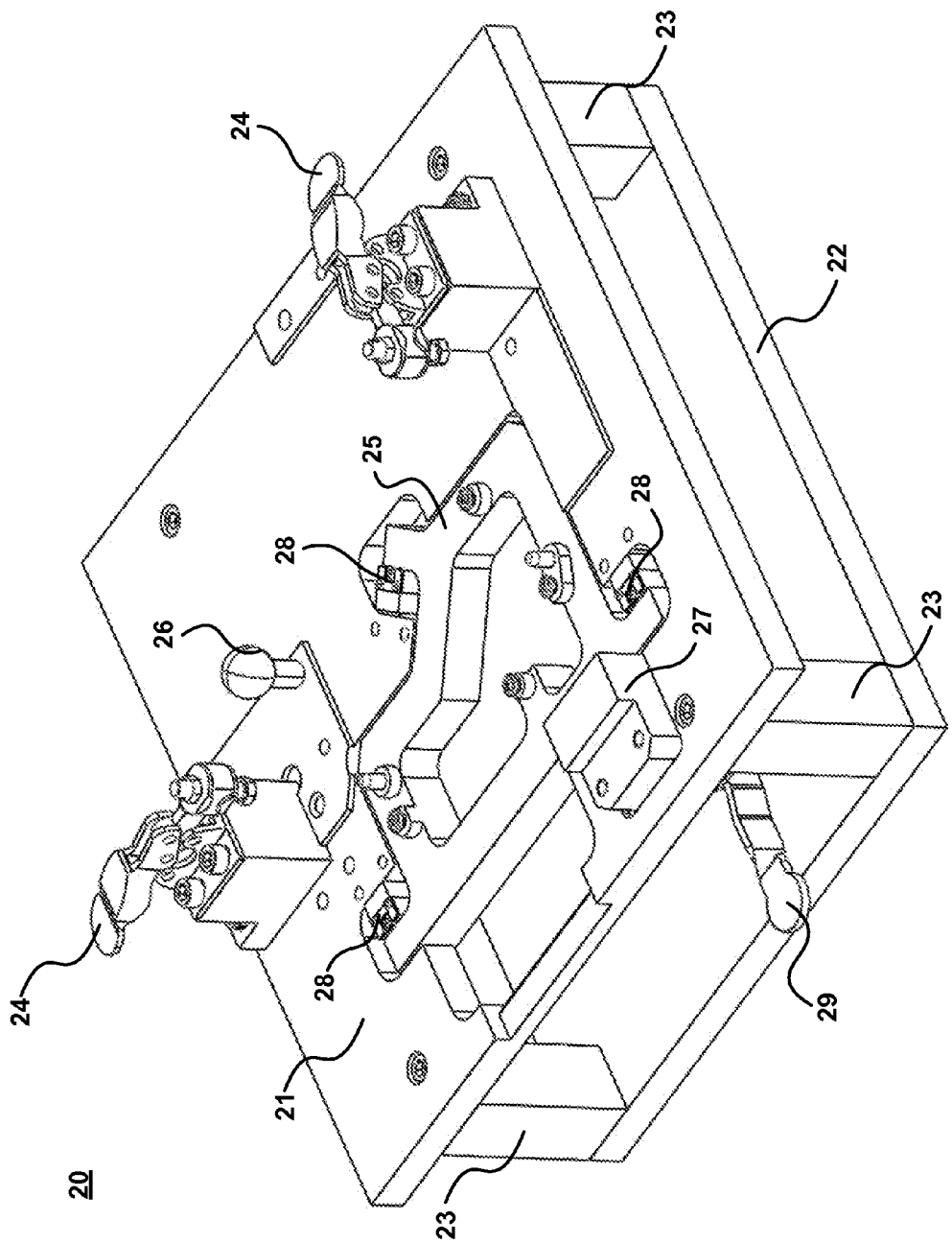
FIG. 2 is a perspective view of a test platform chassis according to one configuration.

FIG. 2 is a perspective view of tester chassis 20 according to one embodiment. Tester chassis 20 includes chassis plate 21, base plate 22, a plurality of pillars 23, a plurality of clamps 24, and a printed circuit board assembly mount 25. In the exemplary configuration shown in FIG. 2, two clamps 24 are attached to an upper surface of chassis plate 21 and arranged to allow an operator to removably mount disk spindle assembly cartridge 40 and head stack assembly cartridge 60 to the upper surface of chassis plate 21. Clamps 24 may be toggle clamps or other clamping devices known to those skilled in the art. In addition to clamps 24, tooling ball 26 and cartridge support 27 are also attached to the upper surface of chassis plate 21. Tooling ball 26 provides a stop to help align disk spindle assembly cartridge 40 when being mounted on the upper surface of chassis plate 21. Cartridge support 27 supports head stack assembly cartridge 60 when mated to disk spindle assembly cartridge 40 and mounted on tester chassis 20. In certain configurations, screws or other fasteners may be used to mount and secure disk spindle assembly cartridge 40 and/or head stack assembly cartridge 60 to the upper surface of chassis plate 21.

Printed circuit board assembly mount 25 provides a platform for mounting printed circuit board assembly 80 to tester chassis 20. Printed circuit board assembly 80 may be mounted to an upper surface of mount 25 using screws or other fasteners. Mount 25 may be made from a metal or metal alloy, such as aluminum, and insulative supports or spacers may be positioned between mount 25 and printed circuit board assembly 80. Mount 25 may be attached to chassis plate 21 using slide assemblies 28, which allow mount 25 to be raised and lowered with respect to chassis plate 21. Mount 25 may be held in a raised position with respect to chassis plate 21 using one or more clamps 29 attached to the bottom surface of chassis plate 21. Using this configuration, printed circuit board assembly 80 mounted to mount 25 can be lowered away from chassis plate 21 when mounting head stack assembly cartridge 60 and/or disk spindle assembly cartridge 40. After head stack assembly cartridge 60 and/or disk spindle assembly cartridge 40 are secured to the upper surface of chassis plate 21, mount 25 can be raised using clamp 29 to bring printed circuit board assembly 80 into electrical contact with head stack assembly cartridge 60 and disk spindle assembly cartridge 40. In this regard, printed circuit board assembly 80 includes a first interface configured to make electrical contact and communicate electrical power and signals with the spindle motor in disk spindle assembly cartridge 40. Printed circuit board assembly 80 also includes a second interface configured to make electrical contact and communicate electrical power and signals with a flex cable assembly of the head stack assembly mounted in head stack assembly cartridge 60. Printed circuit board assembly 80 further includes a third interface configured to make electrical contact and communicate electrical signals with a tester controller.

Printed circuit board assembly 80 may be similar or identical to printed circuit board assemblies used in hard drives using similar or identical interfaces for communicating with connected components. Using production printed circuit board assemblies reduces costs involved in implementing tester 10 and allows for standard interface connections and protocols to be used for communication between tester 10 and the tester controller. Furthermore, production flex cable assemblies and spindle motors may be connected to printed circuit board assembly 80 with little or no modification to the interfaces used to connect these components in production hard drives.

In the exemplary configuration shown in FIG. 2, chassis plate 21 is supported by a plurality of pillars 23, which are mounted to base plate 22. Pillars 23 secure chassis plate 21 above base plate 22 with sufficient height to allow the operation of clamp 29 to raise and lower printed circuit board assembly mount 25. In alternative configurations, chassis plate 21 may be mounted in a rack or other support structure instead of to pillars 23 and base plate 22. Chassis plate 21, base plate 22 and pillars 23 may be made from a metal or metal alloy, such as aluminum, and may be attached to one another using screws, welding, adhesives, or other known fasteners.

Figure 3:
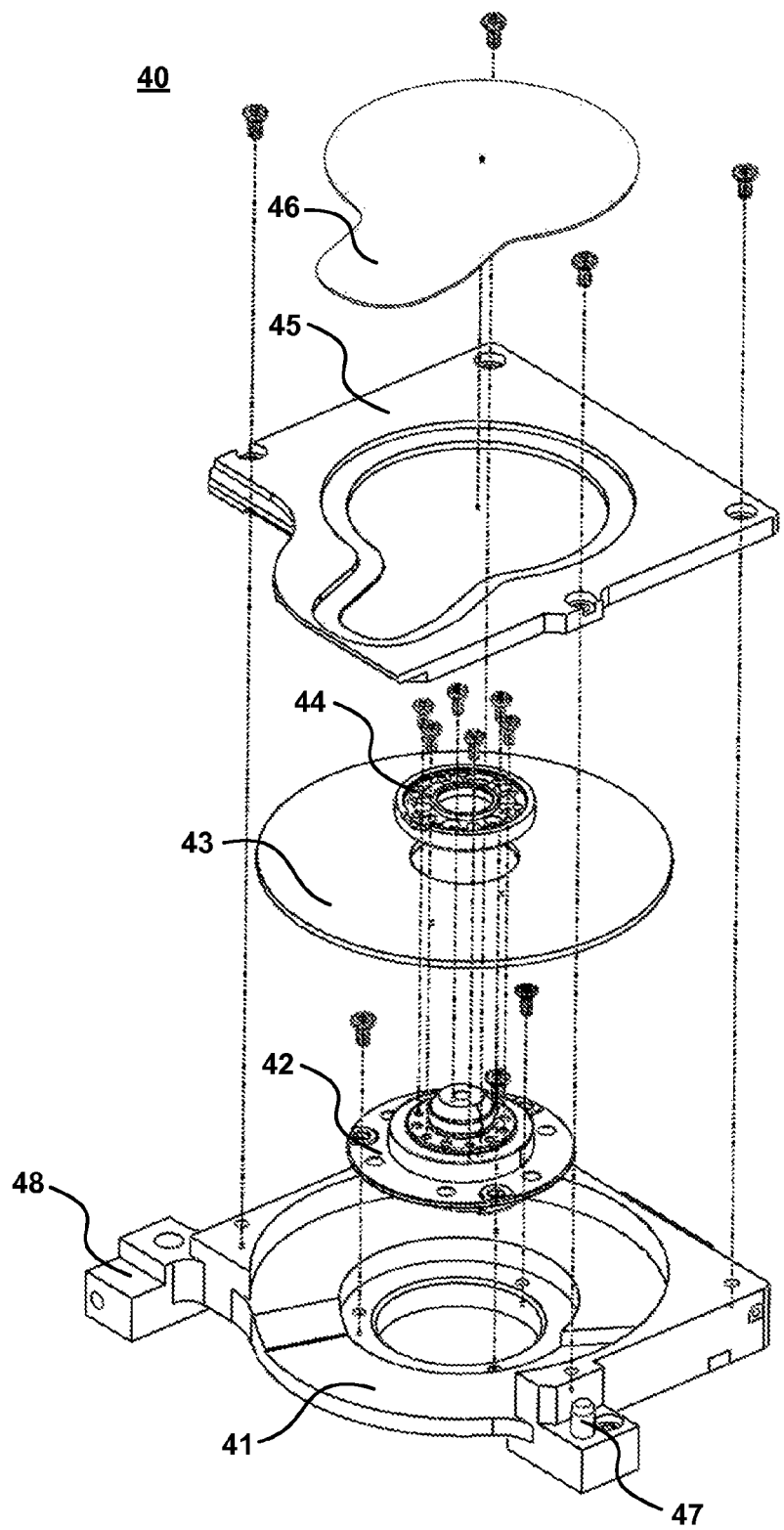
FIG. 3 is an exploded view of a disk spindle assembly cartridge according to one configuration.

FIG. 3 is an exploded view of disk spindle assembly cartridge 40 according to one embodiment. Disk spindle assembly cartridge 40 includes base 41, spindle motor 42, magnetic disk 43, disk clamp 44, and cover plate 45. Spindle motor 42 is attached to an inner surface of base 41 and is configured to make electrical contact with an interface on printed circuit board assembly 80 when mounted on tester chassis 20. Spindle motor 42 may be similar or identical to spindle motors used in production hard drives. Spindle motor 42 may be attached to the inner surface of base 41 using screws or other fasteners known to those skilled in the art.

Magnetic disk 43 is seated on spindle motor 42 and is secured to spindle motor 42 by disk clamp 44. Disk clamp 44 may be attached to spindle motor 42 using screws or other fasteners through a central opening in magnetic disk 43. As the screws or other fasteners are tightened, the perimeter of disk clamp 44 applies pressure on the upper surface of magnetic disk 43 thereby preventing slippage between magnetic disk 43 and a spindle of spindle motor 42. Magnetic disk 43 and disk clamp 44 may be similar or identical to magnetic disks and disk clamps used in production hard drives.

Magnetic disk 43 may be encoded with servo data used as initial seeds to generate servo tracks on magnetic disk 43 for positioning a head gimbal assembly at an intended position to conduct tests. Magnetic disk 43 also may be encoded with servo tracks ready for use in positioning a head gimbal assembly at an intended position to conduct tests. In addition, application information supplementing servo patterns on magnetic disk 43 may be encoded on magnetic disk 43 or at another storage location accessible to a test controller executing tests using tester 10. The application information supplementing servo patterns may include information on any deviation of each track with respect to roundness and spacing of adjacent tracks on magnetic disk 43, defects on the surface of magnetic disk 43, etc. Information for performing channel optimization for purposes of testing also may be encoded on magnetic disk 43.

Cover plate 45 is attached to base 41, which together partially enclose magnetic disk 43. Cover plate 45 may be attached to base 41 using screws or other fasteners. An opening is defined along one side of disk spindle assembly cartridge 40 that provides access to magnetic disk 43 by a head stack assembly when disk spindle assembly cartridge 40 is mated with head stack assembly cartridge 60. As will be discussed in more detail below, disk spindle assembly cartridge 40 may be mated with head stack assembly cartridge 60 using pivot pin 47 set in base 41 and alignment mount 48 of base 41. In one configuration, cover plate 45 defines an opening in which transparent window 46 is set to allow visual observation during operation of test station 10. Window 46 may be made of plastic or glass. Window 46 may be set in the opening of cover plate 45 using an adhesive or may rely on a pressure fit to remain set. Base 41 and cover plate 45 may be made of a metal or metal alloy for durability and strength. For example, base 41 and/or plate 45 may be made from aluminum or an aluminum alloy. Alternatively, a more durable material such as stainless steel may be used for base 41 and/or plate 45.

Figure 4:
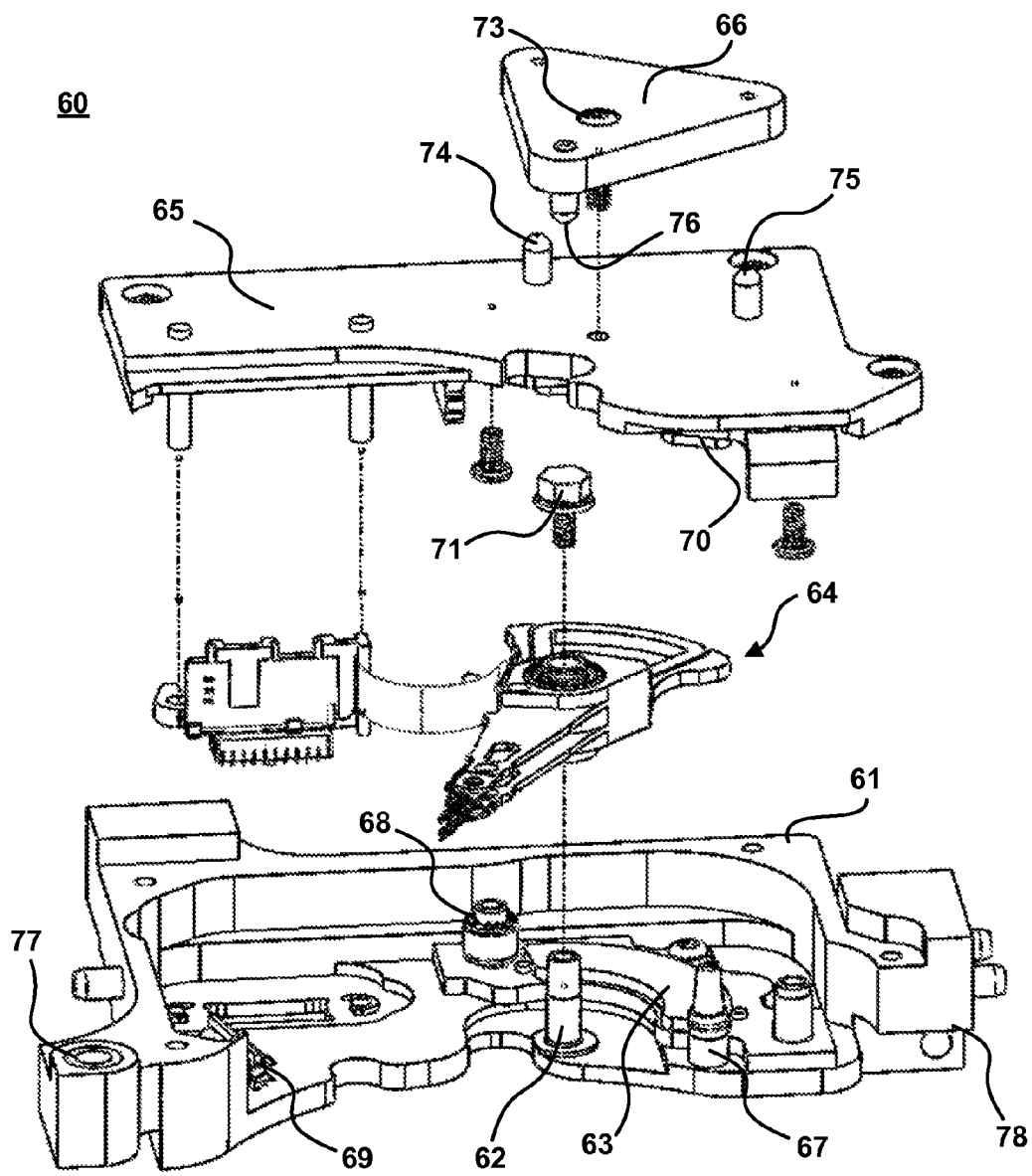
FIG. 4 is an exploded view of a head stack assembly cartridge according to one configuration.

FIG. 4 is an exploded view of head stack assembly cartridge 60 according to one embodiment. Head stack assembly cartridge 60 includes base plate 61, pivot shaft 62, base magnet 63, head stack assembly 64, cover plate 65 and pivot clamp 66. As shown in FIG. 4, pivot shaft 62 and base magnet 63 are arranged on an inner surface of base plate 61. Pivot shaft 62 is arranged on the inner surface of base plate 61 to pivotally mount head stack assembly 64. Specifically, pivot shaft 62 is arranged to engage a pivot assembly of head stack assembly 64, which allows an actuator coil assembly of head stack assembly 64 to pivot about pivot shaft 62. Base magnet 63 is positioned on the inner surface of base plate 61 to be adjacent to a coil of head stack assembly 64 when mounted to form a voice coil motor for controlling the movement of the actuator coil assembly about pivot shaft 62. Stops 67 and 68 are arranged on the inner surface of base plate 61 to limit the range of rotation (i.e., angular displacement) in either direction of rotation available to the actuator coil assembly of head stack assembly 64. Ramp 69 is arranged on the inner surface of base plate 61 for parking the actuator coil assembly when not in operation. Stops 67 and 68 and ramp 69 may be similar or identical to those used in production hard drives.

As noted above, head stack assembly 64 includes an actuator coil assembly having a pivot assembly and a coil. Head stack assembly 64 further includes a flex cable assembly for electrically connecting head stack assembly 64 to an interface on printed circuit board assembly 80. Electrical power and control signals are communicated between printed circuit board assembly 80 and head stack assembly 64 via the flex cable assembly. Head stack assembly 64 may be similar or identical to head stack assemblies used in production hard drives. For example, testing platform 10 may be used to test the head stack assembly prior to being assembled in a production hard drive. Alternatively, head stack assembly 64 may be modified to allow head gimbal assemblies to be detachably mounted for testing. For example, the actuator coil assembly may be modified to include the mounting mechanism described in U.S. patent application Ser. No. 12/500,546, entitled "Head Gimbal Assembly Mounting Mechanism" and filed on Jul. 9, 2009, and the clamping mechanism described in U.S. patent application Ser. No. 12/494,869, entitled Dual-State Clamping Mechanism" and filed on Jun. 30, 2009, both of which are hereby incorporated by reference herein.

Cover plate 65 is attached to base plate 61 using screws or other fasteners that allow cover plate 65 to be removable from base plate 61. In one configuration, cover magnet 70 is attached to the inner surface of cover plate 65. Cover magnet 70 is arranged on the inner surface of cover plate 65 to be adjacent to the coil of head stack assembly 64 when mounted on pivot shaft 62 and opposite base magnet 63. Base magnet 63, cover magnet 70 and the coil of head stack assembly 64 form a voice coil motor for controlling the movement of the actuator coil assembly of head stack assembly 64.

Head stack assembly 64 may be attached to pivot shaft 62 using pivot screw 71. To secure and stabilize head stack assembly 64 during operation, pivot clamp 66 is attached to cover plate 65 with load screw 73 to apply a load to pivot screw 71 attaching head stack assembly 64 to pivot shaft 62. In the exemplary configuration depicted in FIG. 4, pivot clamp 66 is a triangular plate with two corners configured to be seated on pins 74 and 75 set in cover plate 65. Pin 76 is set in the third corner of pivot clamp 66 and is arranged to be seated on the head of pivot screw 71. Load screw 73 may be arranged along the altitude of the triangular plate extending from the third corner to the mid-point between the other two corners in order to balance pivot clamp 66 between pins 74 and 75. Tightening load screw 73 increases the load placed on the head of pivot screw 71 with pins 74 and 75 acting as a fulcrum for pivot clamp 66, which stabilizes the actuator coil assembly of head stack assembly 64 during operation of tester 10. In an alternative configuration, pivot clamp 66 may be attached to cover plate 65 with a hinge and preloaded with a spring to apply a load to pivot screw 71. Load screw 73 may be used to increase the load applied to pivot screw 71 above what is available using the spring alone.

In an alternative configuration, cover plate 65 may be attached to base plate 61 with a hinge along one side of cover plate 65 and a corresponding side of base plate 61. A clamp screw or other fastener may be used on the opposite side of cover plate 65 and base plate 61 to hold the two components together. This hinged implementation of cover plate 65 and base plate 61 allows relatively easy access inside head stack assembly cartridge 60 to facilitate the exchange of head stack assembly 64 and/or a head gimbal assembly detachably mounted on the actuator arm of head stack assembly 64.

Base plate 61, cover plate 65 and pivot clamp 66 may be made of a metal or metal alloy for durability and strength. For example, aluminum or an aluminum alloy may be used for base plate 61, cover plate 65 and/or pivot clamp 66. Alternatively, a more durable material such as stainless steel may be used for base plate 61, cover plate 65 and/or pivot clamp 66.

Figure 5:
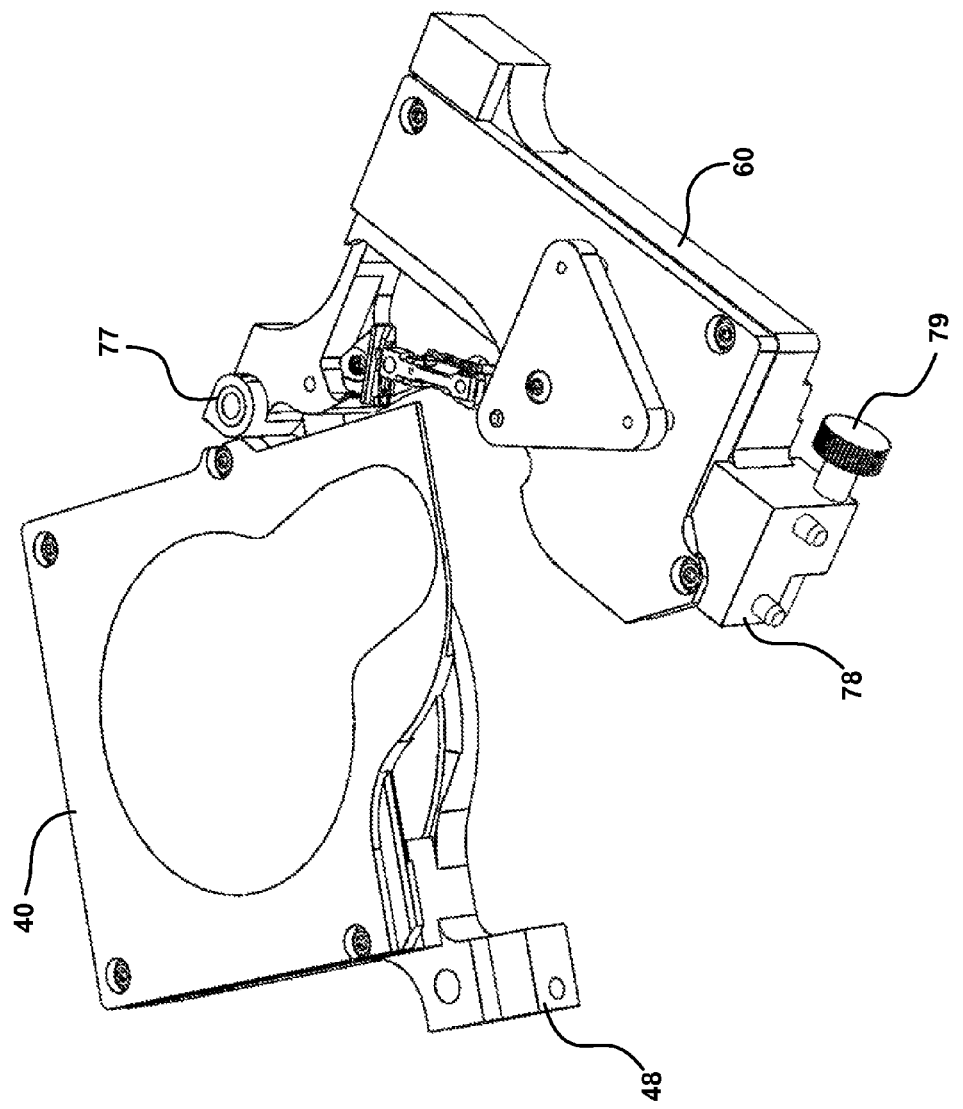
FIG. 5 is a perspective view of a head stack assembly cartridge pivotally coupled to a disk spindle assembly cartridge according to one configuration.

Base plate 61 further includes pivot arm 77 and alignment mount 78. Pivot arm 77 defines a bore which is arranged to receive pivot pin 47 of disk spindle assembly cartridge 40 to pivotally couple head stack assembly cartridge 60 with disk spindle assembly cartridge 40. FIG. 5 is a perspective view of head stack assembly cartridge 60 pivotally coupled to disk spindle assembly cartridge 40 according to one embodiment. As head stack assembly cartridge 60 is pivoted with respect to disk spindle assembly cartridge 40, alignment mount 78 on head stack assembly cartridge 60 ultimately meets and aligns with alignment mount 48 on disk spindle assembly cartridge 40 in a closed position. Specifically, alignment mounts 48 and 78 may be configured with opposing steps so that alignment mounts 48 and 78 interlock with both vertical and opposing mating surfaces. In this manner, head stack assembly cartridge 60 is aligned with disk spindle assembly cartridge 40 to allow head stack assembly 64 to access magnetic disk 43 contained within disk spindle assembly cartridge 40. Thumb screw 79, or another fastener, may be used to lock alignment mounts 48 and 78 together.

When mated together, disk spindle assembly cartridge 40 and head stack assembly cartridge 60 create an internal environment similar to that of a production hard drive. The interior dimensions of disk spindle assembly cartridge 40 and head stack assembly cartridge 60 are similar to those of a production hard drive. This similarity both allows components from production hard drives to be used in these modules as well as creates similar environmental conditions under which component testing can be performed.

The configurations of the disk spindle assembly cartridge and the head stack assembly cartridge are not limited to those described above. For example, the disk spindle assembly cartridge may include more than one magnetic disk seated on and secured to the spindle motor. Correspondingly, the head stack assembly in the head stack assembly cartridge may include multiple head gimbal assemblies arranged to access one or both sides of each of the magnetic disks in the disk spindle assembly cartridge.

Figure 7:
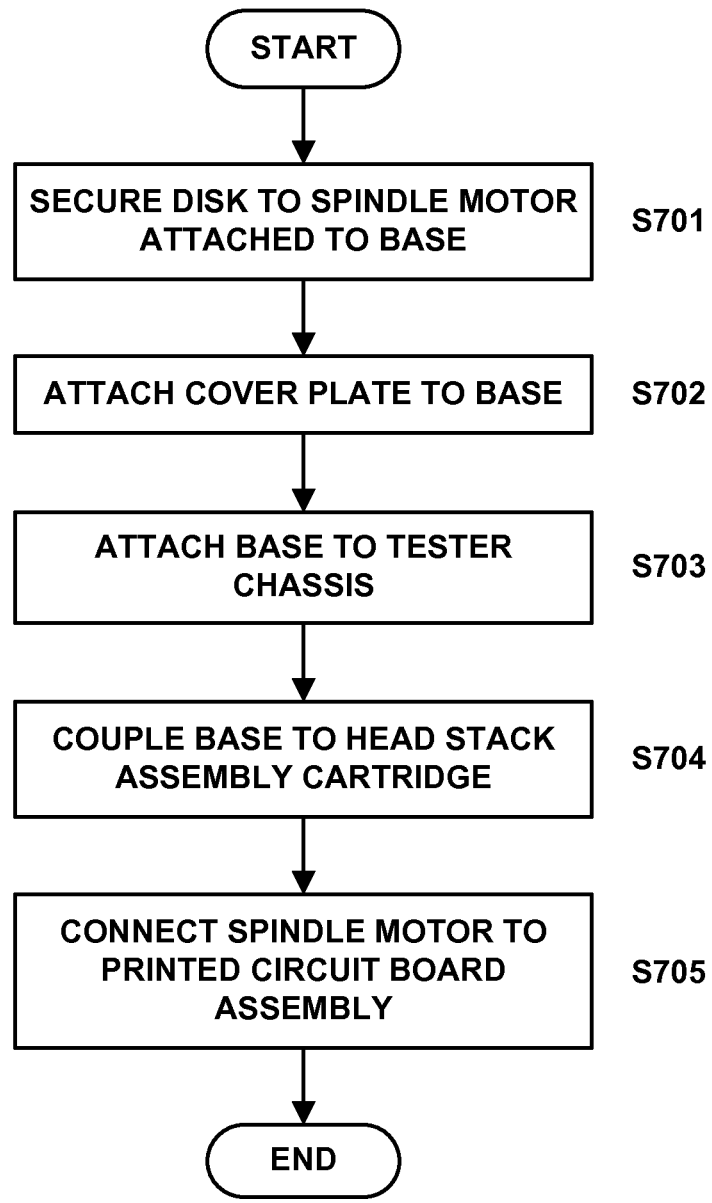
FIG. 7 is a flowchart depicting steps of a method for test mounting a magnetic disk according to one configuration.

FIG. 7 is a flowchart depicting steps of a method for test mounting a magnetic disk according to one configuration of the components described above. In step S701, magnetic disk 43 is secured to spindle motor 42 attached to base 41. As discussed above, magnetic disk 43 may be secured to spindle motor 42 by seating magnetic disk 43 on spindle motor 42 and attaching disk clamp 44 to spindle motor 42 through a central opening in magnetic disk 43. Disk clamp 44 may be attached to spindle motor 42 using screws or other fasteners, which apply pressure on magnetic disk 43 to prevent slippage between magnetic disk 43 and spindle motor 42. In step S702, cover plate 45 is attached to base 41, thereby partially enclosing magnetic disk 43. Cover plate 45 and base 41 define an opening to make magnetic disk 43 accessible to a head stack assembly.

In step S703, base 41 is attached to tester chassis 20. Base 41 may be attached to tester chassis 20 using one or more clamps 24 or other fasteners. In step S704, base 41 is coupled to head stack assembly cartridge 60. For example, pivot pin 47 on base 41 may be aligned with a bore in pivot arm 77 on head stack assembly cartridge 60, thereby pivotally coupling base 41 to head stack assembly cartridge 60. Head stack assembly cartridge 60 may be pivoted about pivot pin 47 until alignment mount 48 meets and aligns with alignment mount 78 of head stack assembly cartridge 60. Base 41 may be secured to head stack assembly cartridge 60 using thumb screw 79 threaded through alignment mount 78 and alignment mount 48. In step S705, spindle motor 42 is electrically connected to printed circuit board assembly 80 mounted on tester chassis 20. As described above, spindle motor 42 may be brought into electrical contact with an interface on printed circuit board assembly 80. This electrical contact may be facilitated by raising printed circuit board assembly 80 mounted on mount 25 by operation of clamp 29 and slide assemblies 28.

Figure 6:
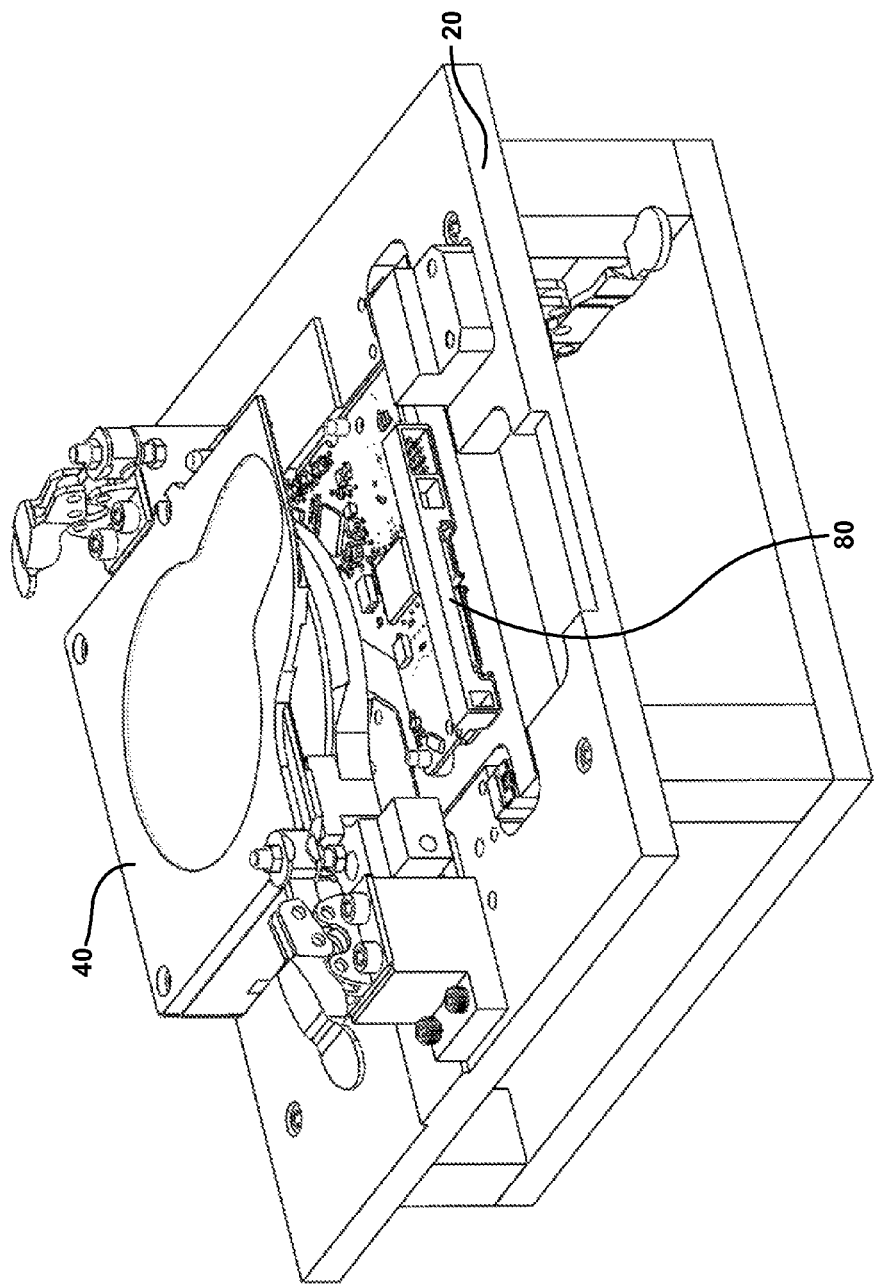
FIG. 6 is a perspective view of a hard drive component test platform according to one configuration.

As described above, tester 10 is a modular hard drive component tester. Tester 10 is designed to allow one or more of the modules making up the system to be exchanged relatively quickly and easily. For example, tester 10 may be used to test head stack assemblies. To test a series of head stack assemblies, tester 10 may be arranged as shown in FIG. 6, with disk pack assembly pack 40 and printed circuit board assembly 80 mounted to tester chassis 20. Each of the head stack assemblies may be mounted in respective head stack assembly cartridges 60, which are sequentially mounted on tester chassis 20. Once mated with disk spindle assembly cartridge 40 and electrically connected to an interface on printed circuit board assembly 80, the head stack assembly may be tested. Once testing is complete, the head stack assembly cartridge is removed from tester chassis 20 and the next head stack assembly cartridge is mounted. Alternatively, cover plate 65 may be removed from base plate 61 while head stack assembly cartridge 60 remains mounted to tester chassis 20. Once cover plate 65 is removed, an operator can swap head stack assembly 64 or a head gimbal assembly detachably mounted to the actuator arm of head stack assembly 64 and replace cover plate 65. Similar processes may be used to exchange magnetic disks in disk spindle assembly cartridges either by swapping the disk spindle assembly cartridge mounted on the tester chassis or by removing cover plate 45.

The hard drive component tester described herein is not limited to the mounting and alignment configurations described above. For example, tester chassis 20 may be configured with tracks in which disk spindle assembly cartridge 40 and head stack assembly cartridge 60 are slidably mounted using rails or another structure corresponding to the tracks on tester chassis 20. The tracks on tester chassis 20 and the rails on disk spindle assembly cartridge 40 and head stack assembly cartridge 60 keep the components aligned with one another when mounted on tester chassis 20. Clamps or other locking mechanisms may be used to hold disk spindle assembly cartridge 40 and head stack assembly cartridge 60 together and in place during test operations.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A disk spindle assembly cartridge, comprising:
a base;
a spindle motor attached to the base;
a disk seated on the spindle motor;
a disk clamp attached to the spindle motor, wherein the disk clamp secures the disk to the spindle motor; and
a cover attached to the base,
wherein the base is configured to detachably mount a head stack assembly cartridge located outside the base and the cover when unmounted, and wherein the disk is accessible to a head stack assembly pivotally mounted in the head stack assembly cartridge via an opening defined by the base and the cover.

2. The disk spindle assembly cartridge according to claim 1, wherein the cover comprises a transparent window.

3. The disk spindle assembly cartridge according to claim 1, further comprising a pivot pin set in the base, wherein the pivot pin is configured to pivotally couple the head stack assembly cartridge to the disk spindle assembly cartridge.

4. The disk spindle assembly cartridge according to claim 3, wherein the base comprises an alignment mount arranged on the base, and
wherein the alignment mount is configured to align the disk spindle assembly cartridge with the head stack assembly cartridge in a closed position.

5. The disk spindle assembly cartridge according to claim 4, wherein the alignment mount is further configured to receive a fastener for securing the head stack assembly cartridge to the disk spindle assembly cartridge in the closed position.

6. The disk spindle assembly cartridge according to claim 1, wherein the disk clamp is removably attached to the spindle motor and the cover is removably attached to the base.

7. The disk spindle assembly cartridge according to claim 1, wherein the disk is encoded with test data.

8. A disk spindle assembly cartridge, comprising:
a base;
a spindle motor attached to the base;
a disk seated on the spindle motor;
a disk clamp attached to the spindle motor, wherein the disk clamp secures the disk to the spindle motor; and
a cover attached to the base,
wherein the base is configured to detachably mount a head stack assembly cartridge separate from the disk spindle assembly cartridge, and wherein the disk is accessible to a head stack assembly pivotally mounted in the head stack assembly cartridge via an opening defined by the base and the cover.

9. The disk spindle assembly cartridge according to claim 8, wherein the cover comprises a transparent window.

10. The disk spindle assembly cartridge according to claim 8, further comprising a pivot pin set in the base, wherein the pivot pin is configured to pivotally couple the head stack assembly cartridge to the disk spindle assembly cartridge.

11. The disk spindle assembly cartridge according to claim 10, wherein the base comprises an alignment mount arranged on the base, and
wherein the alignment mount is configured to align the disk spindle assembly cartridge with the head stack assembly cartridge in a closed position.

12. The disk spindle assembly cartridge according to claim 11, wherein the alignment mount is further configured to receive a fastener for securing the head stack assembly cartridge to the disk spindle assembly cartridge in the closed position.

13. The disk spindle assembly cartridge according to claim 8, wherein the disk clamp is removably attached to the spindle motor and the cover is removably attached to the base.

14. The disk spindle assembly cartridge according to claim 8, wherein the disk is encoded with test data.

* * * * *